United States Patent [19]

Ipri

[11] 4,016,016

[45] Apr. 5, 1977

[54] METHOD OF SIMULTANEOUSLY FORMING A POLYCRYSTALLINE SILICON GATE AND A SINGLE CRYSTAL EXTENSION OF SAID GATE IN SILICON ON SAPPHIRE MOS DEVICES

[75] Inventor: Alfred Charles Ipri, Princeton, N.J.

[73] Assignee: RCA Corporation, New York, N.Y.

[22] Filed: May 22, 1975

[21] Appl. No.: 579,967

[52] U.S. Cl. .................................. 148/175; 29/571; 29/578; 148/174; 156/648; 357/4; 357/41; 357/42; 357/56; 357/59; 357/65

[51] Int. Cl.² ................ H01L 21/203; H01L 21/84; H01L 29/78

[58] Field of Search ............. 148/174, 175; 156/17; 357/59, 56, 42, 41, 65, 4; 29/571, 578

[56] References Cited

UNITED STATES PATENTS

| | | | |
|---|---|---|---|
| 3,519,901 | 7/1970 | Bean et al. | 148/174 X |
| 3,584,183 | 6/1971 | Chiaretta et al. | 357/4 X |
| 3,699,646 | 10/1972 | Vadasz | 29/571 |
| 3,739,238 | 6/1973 | Hara | 357/42 X |
| 3,749,614 | 7/1973 | Boleky et al. | 148/174 X |
| 3,750,268 | 8/1973 | Wang | 29/571 |
| 3,796,597 | 3/1974 | Porter et al. | 148/175 X |
| 3,821,781 | 6/1974 | Chang et al. | 357/42 X |
| 3,890,632 | 6/1975 | Ham et al. | 357/56 X |

OTHER PUBLICATIONS

Ronen et al., "Recent Advances in Thin-Film Silicon—Sapphire" Proc. IEEE, vol. 59, No. 10, Oct. 1971, pp. 1506–1510.

Zulegg, R., "Silicon-on-Sapphire—Microwave IC's" Electronics, Mar. 20, 1967, pp. 106–108.

Eaton, S. S., "Sapphire Brings Out the Best in C–MOS" Electronics, June 12, 1975, pp. 115–118.

Primary Examiner—L. Dewayne Rutledge
Assistant Examiner—W. G. Saba
Attorney, Agent, or Firm—H. Christoffersen; R. P. Williams; W. L. Muckelroy

[57] ABSTRACT

An improvement in polycrystalline silicon gate MOS integrated circuits made of silicon mesas on a sapphire substrate is provided. The improvement is an extension of a polycrystalline silicon gate onto the sapphire substrate as a single crystal layer. The single crystal layer is anisotropically etched to slant its sidewalls. Metal contacts traversing the slanted sidewalls exhibit increased continuity and the single crystal layer exhibits improved conductivity. The polycrystalline silicon and single crystal silicon are formed simultaneously from a single source.

6 Claims, 2 Drawing Figures

METHOD OF SIMULTANEOUSLY FORMING A POLYCRYSTALLINE SILICON GATE AND A SINGLE CRYSTAL EXTENSION OF SAID GATE IN SILICON ON SAPPHIRE MOS DEVICES

The present novel invention is related to methods for depositing layers of silicon onto a substrate. It is particularly related to methods for depositing silicon whereby the silicon forms a polycrystalline layer. It is also related to methods for depositing silicon whereby the silicon forms a single crystal layer.

The novel method of the present invention is especially useful in the manufacture of integrated circuits. It is particularly useful in the manufacture of logic circuits made of silicon MOS mesa transistors on a sapphire substrate where speed of operation and reliability are very important. The novel method provides a silicon connecting layer with improved conductivity which enables faster operation.

Particular shapes of metal contacts have a higher probability of continuity. For example, a metal contact extending over a slanted sidewall of a layer is more likely to be continuous than one extending over a vertical sidewall of a layer. The present novel method provides a conductive layer which facilitates the formation of a metal contact having improved probability of continuity. The present novel structure produced by the present novel method is useful for providing a conductive layer with a higher conductivity relative to other known layers of the same utility. The structure is manufacturable in polycrystalline silicon gate integrated circuits without additional process steps.

It has been proposed in the German Pat. No. 1,358,438 issued in December, 1971 to Heading to form both insulating polycrystalline silicon and single crystal semiconductive silicon on the same substrate. This however has been for the purpose of eliminating edge junctions from devices later formed from the single crystal silicon. The polycrystalline silicon adjacent the single crystal silicon islands serves to isolate the sidewalls of the islands from a subsequently formed gate.

Briefly stated, the present novel structure is a conductive layer partly comprised of polycrystalline silicon and partly comprised of single crystal silicon. In an integrated circuit comprised of a semiconductor island having an amorphous layer on a surface thereof, the semiconductor island being adjacent a single crystal substrate, the two types of silicon merge into each other at the juncture of a sidewall of the silicon island having the amorphous layer thereon and the substrate.

The present novel method incorporates two facts regarding the deposition of silicon from the decomposition of silane ($SiH_4$). First, when silicon is deposited on an amorphous substrate, the resulting layer of silicon is polycrystalline in structure. Second, when silicon is deposited on a single crystal substrate at a specified temperature, the resulting layer is single crystal in structure.

Reference is now made to the drawing wherein.

Although the present novel invention comprising both the method and the structure are of utility in the manufacture of a variety of integrated circuits which may comprise diodes, transistors, capacitors, inductors, as well as specialized devices such as Schottky barrier diodes, zener diodes and the like, these novel inventions are presented herein as incorporated in a single specie, namely, in an integrated inverter circuit comprised of complimentary polycrystalline silicon gate, metal-oxide-semiconductor/silicon-on-sapphire (CMOS/SOS) transistors.

In the polycrystalline silicon gate inverter, the respective gates of the P channel and N channel transistors are interconnected by means of an extension of the polycrystalline silicon onto the sapphire substrate. The new and novel method of the invention produces single crystalline silicon for the extension. In the prior art, the extension onto the sapphire substrate is polycrystalline silicon. Accordingly, an input signal traveling into the extension on the sapphire substrate, the extension being comprised of polycrystalline silicon, exhibits less conductivity than if the extension were comprised of single crystal silicon. Moreover, the sidewalls of a layer of polycrystalline silicon are substantially vertical when etched with presently known methods. Discontinuities are more apt to occur in metal contacts which extend up these substantially vertical sidewalls and onto the polycrystalline silicon layer. However, the extensions of the present novel structure, being comprised of single crystal silicon, may be anisotrophically etched.

Anisotrophically etched silicon exhibits sidewalls which are slanted with respect to the supporting substrate. The slanted sidewalls of anistrophically etched silicon provide a surface which may be more reliably traversed by a metal contact.

The term polycrystalline silicon as used herein refers to silicon which has a disordered crystallographic structure. As the crystallites themselves become smaller and approach the submicron level, polycrystalline silicon material approaches amorphous silicon in quality. Amorphous silicon as well as the polycrystalline silicon have certain disordering of the crystallographic structure and are both characterized by the speed at which doping impurity atoms travel therethrough. Thus, when the term polycrystalline silicon is used, it refers not only to the rather large grain polycrystalline silicon gate contacts described herein but also to amorphous silicon contacts provided by the novel method where the difference lies in the size of the crystallite structures.

Figure 1:
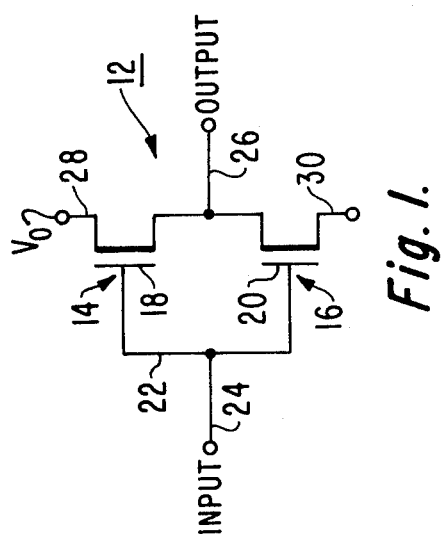
FIG. 1 is a circuit diagram of an inverter.

Referring to FIG. 1, there is shown a circuit in the form of an inverter 12 which is comprised of a P channel transistor 14 and an N channel transistor 16. In the inverter 12, the gates 18 and 20 of the respective transistors are interconnected by a path 22. An input 24 is provided and is connected to the path 22. An output 26 is connected to the drains of the transistors 14 and 16. An operating voltage is applied via the contact 28 for the source of the transistor 14 and the contact 30 for the source of the transistor 16. The speed of operation of the inverter schematically shown in FIG. 1 is limited by the conductivity of the path 22. In the present novel structure, the path 22 is comprised of highly doped single crystal silicon. Highly doped single crystal silicon exhibits a substantially higher mobility and therefore a substantially higher conductivity when compared with a known embodiment of the path 22 comprised of polycrystalline silicon.

Figure 2:
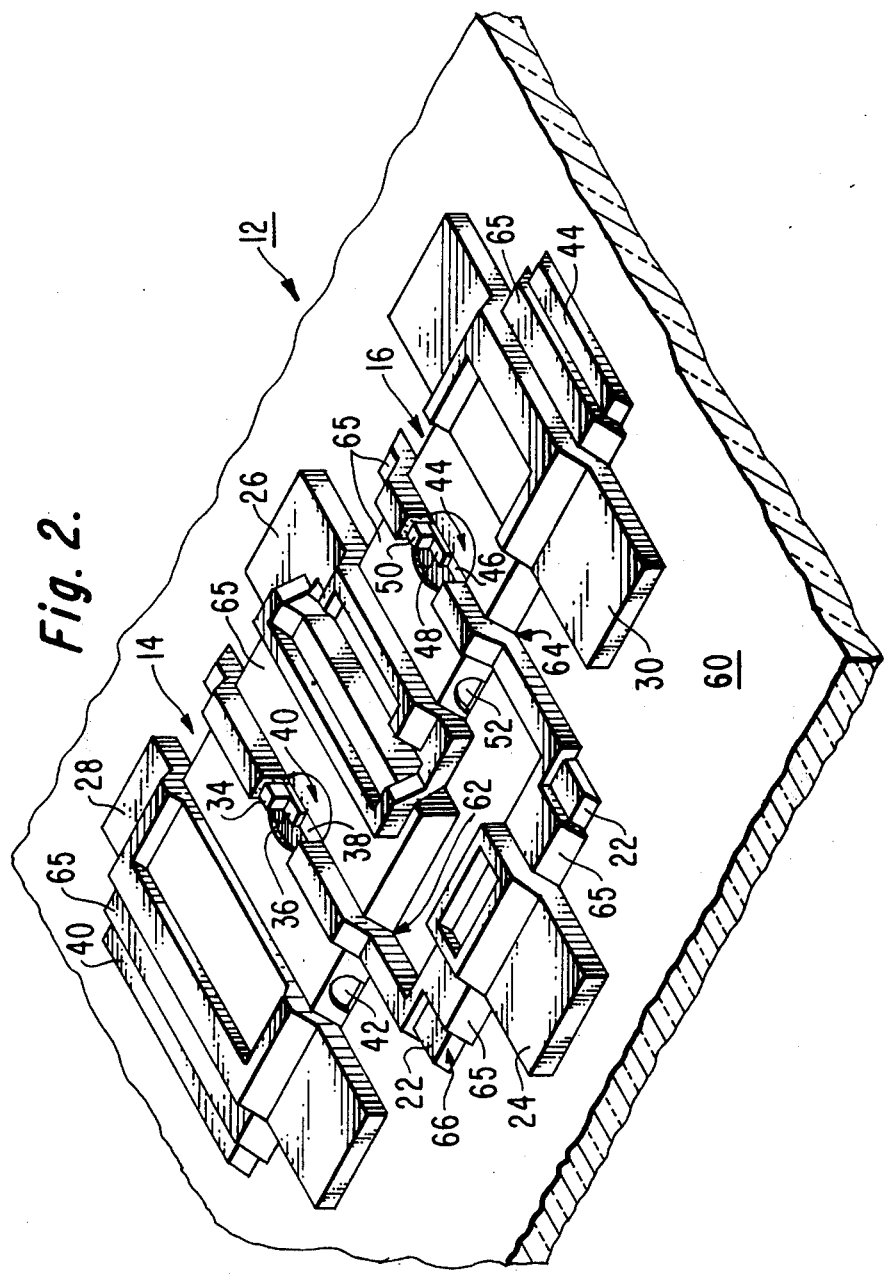
FIG. 2 is a perspective illustration of a physical embodiment of the inverter of FIG. 1 as a polycrystalline silicon gate CMOS/SOS inverter with a single crystal silicon extension (or layer) interconnecting the gates.

Shown in FIG. 2 is an embodiment of the inverter 12 in the form of a polycrystalline silicon gate CMOS/SOS inverter with a layer of single crystal silicon serving as the path 22 (the layer being exposed for illustration). The transistor 14 has a gate which is comprised of a strip 34 of polycrystalline silicon resting on a layer 36 of an amorphous dielectric, such as, for example, silicon dioxide ($SiO_2$) or silicon nitride ($Si_3N_4$). The strip 34 overlies a channel 38 for the transistor 14. The strip 34 extends across a principal surface of a semiconductor mesa 40 spaced thereabove by the layer 36. The strip 34 then extends down a sidewall 42 of the mesa 40 and is connected to the path 22. (Strip 34, layer 36, channel 38, mesa 40, and sidewall 42 are exposed for illustration.)

The transistor 16 shown in FIG. 2 is comprised of a semiconductor mesa 44. The mesa 44 has a channel 46 defined by an amorphous layer 48 of an insulator such as, for example, silicon dioxide ($SiO_2$) or silicon nitride ($Si_3N_4$). A strip 50 of polycrystalline silicon is spaced above the channel 46 by the layer 48. The strip 50 extends across a principal surface of the semiconductor mesa 44 along the channel 46 and down a sidewall 52 of the mesa 44 and connects to the path 22. (The mesa 44, channel 46, layer 48, strip 50, and sidewall 52 are exposed for illustration.)

A portion of the polycrystalline silicon strip 34 extends onto a substrate 60 at an interface 62 between the layer 36 and the substrate 60. A portion of the polycrystalline silicon gate 50 extends onto the substrate 60 at an interface 64 between the layer 48 and the substrate 60. From the interfaces 62 and 64 to the connections with the path 22 these portions of the gates 34 and 50 are single crystal silicon. Moreover, the path 22 which is but a further extension and interconnection of the gates 34 and 50, is comprised of the same single crystal silicon.

The path 22 has a principal surface surrounded by slanted sidewalls. An input 24 of metal is connected to the path 22 via an aperture formed in a portion of a layer 65 of, for example, deposited silicon dioxide, on the path 22. The input 24 extends from the aperture across a principal surface of a portion of the layer 65 on the path 22 down a sidewall of the aforementioned portion which sidewall conforms to a slanted sidewall 66 of the path 22. However, metal conductors similar to and in addition to the metal input 24 may in some versions of the present embodiment not be connected to the path 22. These conductors may simply pass over the path 22, i.e., act as a cross-over. The sidewall 66 of the path 22 forms an acute angle with the substrate 60, the angle enclosing the path 22. The input 24 then extends onto the substrate 60. It is advantageous for the metal input 24 to extend across the slanted sidewall of the aforementioned portion of layer 65 rather than across a vertical sidewall.

The integrated inverter circuit 12 is completed by opening source contact holes in principal surfaces of the layer 65 adjacent the mesas 40 and 44 and forming contacts 28 and 30 in the sources of the transistors 14 and 16, respectively, and making a common opening to the drains of the respective transistors 14 and 16 and forming a conductive output 26 therein.

The method for making the structure of the present novel invention requires that silicon be deposited onto a surface of an amorphous layer and a substrate such as, for example, single crystal ($1\bar{1}02$) sapphire, spinel or the like. The silicon may be deposited from a common source onto the substrate and the layer.

In particular layers 36 and 48 of FIG. 2 may be amorphous or noncrystalline layers of an oxide of silicon having a thickness of approximately 1000 A. The layers 36 and 48 may be formed by a reaction of a surface of the silicon islands 40 and 44 with vapor from an azeotropic mixture of hydrochloric acid (HCL) and water at approximately 900° C for 50 minutes. Layer 65 is also an amorphous or non-layer of an oxide of silicon. Layer 65 may be deposited from a pyrolytic reaction of silane ($SiH_4$) with oxygen ($O_2$) at a temperature of about 450° C. The layer may range from 300 to 3000 angstroms or more.

A layer of deposited silicon may be formed by either the pyrolytic decomposition of silane ($SiH_4$) at elevated temperatures or a conventional evaporation technique at elevated temperatures. It is necessary that the deposited silicon be smooth and free of contaminating impurities.

Specifically, the deposited silicon is formed from a silicon source comprised either of silane or silicon pellets. The strips 34 and 50 of deposited silicon may be produced by the decomposition of the silane ($SiH_4$) in hydrogen ($H_2$) at temperatures of approximately 900° C to 1200° C. A thickness for the strips 34 and 50 of deposited silicon may range from 4000 to 14,000 angstroms. In the above mentioned evaporation technique, the silicon pellets may be used as the evaporating technique, the silicon pellets may be used as the evaporating source provided the evaporation occurs in the elevated temperature range of 900° C to 1200° C. The strips 34 and 50 formed on the (amorphous) layers 36 and 48 are polycrystalline silicon whereas the path 22 formed on the (single-crystal) substrate 60 is single-crystal silicon.

The strips 34 and 50 of deposited silicon are coated with the layer 65 of deposited oxide. The layer 65 is defined to expose the deposited single crystal silicon with a buffered hydrofluoric acid etchant using standard photolithographic techniques. The deposited single crystal silicon is then etched by the application of a KOH-n-propanol anisotropic etchant with the masking oxide layer serving as a mask. The application of the anisotropic etchant provides a certain advantage. The anisotropic etchant attacks the <100> planes of the deposited single crystal silicon at a rate substantially in excess of a rate at which it attacks the <111> planes of silicon. Hence, the etchant slants the sidewalls of the deposited single crystal silicon to conform to the angle set by the intersection of the <100> and <111> planes of the silicon crystal structure. This enables a more reliable metal layer to be deposited over the deposited single crystal silicon relative to metal layers deposited over vertical sidewalls. Moreover, the resistivity of the deposited single crystal silicon is less than that for the deposited polycrystalline silicon.

Thus, in accordance with the present novel structure and the present novel method for making this structure an improved means whereby interconnections using conductive silicon are used is provided. Moreover, the use of the method in the manufacture of integrated circuits provides a process means by which substantial improvements in integrated circuits which use deposited silicon may be achieved by deposition at temperatures in excess of 900° C.

I claim:
1. In a method for manufacture of an integrated circuit comprised of devices comprising silicon mesas adjacent a single crystal insulating substrate, the circuit having a connecting strip, the strip extending from the substrate and merging into a conductive layer above the mesa, the improvement comprising making the connecting strip by the steps of:

a. depositing a polycrystalline silicon layer above at least one mesa onto a layer of a noncrystalline material adjacent the mesa from a silicon source evaporated at a temperature between 900° C and 1,200° C;

b. simultaneously depositing a single crystal silicon layer onto the substrate from the same silicon source evaporated at the same temperature, the substrate having an exposed surface oriented for epitaxial growth of silicon thereon; and c. selectively removing portions of the deposited polycrystalline silicon layer and the single crystal layer whereby the polycrystalline silicon layer is shaped to comprise a gate above said mesa and the single crystalline silicon layer is shaped to comprise said connecting strip.

2. The method of claim 1, wherein the single crystal silicon layer is an extension of the polycrystalline silicon gate located on the mesa.

3. The method of claim 2 further comprising the step of depositing a conductive layer above said strip and selectively removing portions of said conductive layer whereby a cross over is formed across said strip.

4. The method of claim 2 further comprising the step of etching said strip with an anisotropic etchant whereby the extension exhibits slanted sidewalls.

5. The method of claim 4 further comprising the steps of depositing a conductor above said strip and selectively removing portions of said conductor.

6. The method of claim 5 wherein the substrate is sapphire and wherein the conductor is a metal.

* * * * *